(12) United States Patent
Male et al.

(10) Patent No.: US 11,538,767 B2
(45) Date of Patent: Dec. 27, 2022

(54) INTEGRATED CIRCUIT PACKAGE WITH PARTITIONING BASED ON ENVIRONMENTAL SENSITIVITY

(71) Applicant: TEXAS INSTRUMENTS INCORPORATED, Dallas, TX (US)

(72) Inventors: Barry Jon Male, West Granby, CT (US); Paul Merle Emerson, Murphy, TX (US); Kurt Peter Wachtler, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/946,868

(22) Filed: Apr. 6, 2018

(65) Prior Publication Data

US 2019/0206806 A1 Jul. 4, 2019

Related U.S. Application Data

(60) Provisional application No. 62/611,839, filed on Dec. 29, 2017.

(51) Int. Cl.
| | |
|---|---|
| *H01L 23/31* | (2006.01) |
| *H01L 23/00* | (2006.01) |
| *H01L 23/34* | (2006.01) |
| *H01L 23/495* | (2006.01) |
| *H01L 23/29* | (2006.01) |
| *H01L 23/057* | (2006.01) |

(52) U.S. Cl.
CPC ......... *H01L 23/562* (2013.01); *H01L 23/057* (2013.01); *H01L 23/29* (2013.01); *H01L 23/315* (2013.01); *H01L 23/345* (2013.01); *H01L 23/49513* (2013.01); *H01L 23/49575* (2013.01); *H01L 24/46* (2013.01); *H01L 24/49* (2013.01); *H01L 23/49541* (2013.01); *H01L 24/45* (2013.01); *H01L 2224/45124* (2013.01); *H01L 2224/45144* (2013.01); *H01L 2224/45147* (2013.01); *H01L 2224/45565* (2013.01); *H01L 2224/45664* (2013.01); *H01L 2924/14* (2013.01)

(58) Field of Classification Search
CPC .................................................... H01L 23/315
USPC ........................................................ 257/678
See application file for complete search history.

(56) References Cited

U.S. PATENT DOCUMENTS

| | | | |
|---|---|---|---|
| 4,814,943 | A | 3/1989 | Okuaki |
| 5,436,203 | A | 7/1995 | Lin |
| 6,472,598 | B1 | 10/2002 | Glenn |
| 6,686,649 | B1 | 2/2004 | Mathews et al. |
| 7,432,586 | B2 | 10/2008 | Zhao et al. |
| 7,872,335 | B2 | 1/2011 | Khan et al. |
| 8,183,687 | B2 | 5/2012 | Khan et al. |
| 8,767,411 | B2 | 7/2014 | Goetz et al. |
| 9,284,182 | B1 | 3/2016 | Shah |
| 9,761,543 | B1 | 9/2017 | Male et al. |
| 9,896,330 | B2 | 2/2018 | Wachtler |

(Continued)

FOREIGN PATENT DOCUMENTS

CN 103193198 7/2013

*Primary Examiner* — Hsin Yi Hsieh
(74) *Attorney, Agent, or Firm* — Dawn Jos; Frank D. Cimino (57) ABSTRACT

An integrated circuit includes a lead frame, a first die, and a second die. The first die is bonded to and electrically connected to the lead frame. The second die is electrically connected to and spaced apart from the first die.

11 Claims, 4 Drawing Sheets

(56) References Cited

U.S. PATENT DOCUMENTS

| | | |
|---|---|---|
| 10,201,072 B2 | 2/2019 | Kuk et al. |
| 10,217,649 B2 | 2/2019 | Lai et al. |
| 10,233,074 B2 | 3/2019 | Wachtler |
| 10,723,616 B2 | 7/2020 | Wachtler |
| 2001/0040280 A1 | 11/2001 | Funakura et al. |
| 2005/0046001 A1 | 3/2005 | Warner |
| 2007/0029569 A1 | 2/2007 | Andrews |
| 2007/0290364 A1 | 12/2007 | Gupta |
| 2008/0122087 A1 | 5/2008 | Jobetto |
| 2008/0217708 A1* | 9/2008 | Reisner ............... H01L 23/645 257/416 |
| 2009/0310322 A1 | 12/2009 | Koh et al. |
| 2010/0078791 A1 | 4/2010 | Yim et al. |
| 2011/0095421 A1 | 4/2011 | Kim et al. |
| 2011/0156178 A1 | 6/2011 | Zuniga-Ortiz et al. |
| 2012/0286405 A1 | 11/2012 | Toyota |
| 2013/0099333 A1 | 4/2013 | Zuniga-Ortiz et al. |
| 2013/0228901 A1 | 5/2013 | Dershem et al. |
| 2013/0187266 A1* | 7/2013 | Chen ............... H01L 25/105 257/737 |
| 2013/0207207 A1 | 8/2013 | McDonald |
| 2013/0328141 A1 | 12/2013 | Ararao |
| 2014/0010374 A1* | 1/2014 | Kasai ............... H04R 3/00 381/26 |
| 2015/0082856 A1* | 3/2015 | Paci ............... G01K 13/00 73/1.01 |
| 2015/0177171 A1 | 6/2015 | Kim |
| 2017/0084519 A1 | 3/2017 | Speight |
| 2017/0197823 A1 | 7/2017 | Wachtler |
| 2018/0061744 A1 | 3/2018 | Railkar et al. |
| 2018/0168029 A1 | 6/2018 | Kuk et al. |

\* cited by examiner

ICS US 11,538,767 B2

INTEGRATED CIRCUIT PACKAGE WITH PARTITIONING BASED ON ENVIRONMENTAL SENSITIVITY

RELATED APPLICATIONS

This application claims priority to U.S. Provisional Application No. 62/611,839, filed Dec. 29, 2017, entitled "Integrated Circuit Package with Partitioning Based on Environmental Sensitivity," which is incorporated herein by reference.

BACKGROUND

The operational characteristics of many circuits change with the environmental conditions in which the circuit operates. For example, temperature and physical stress are two environmental parameters that can affect the operation of electronic components and the circuits in which the components operate.

Precision voltage references are one type of electronic circuit that is sensitive to environmental conditions. Precision voltage references are widely used in electronic systems, such as data acquisition systems, test and measurement equipment and calibration standards. Precision voltage references must maintain accuracy over moderate temperature ranges, temperature cycling, and time. Semiconductor voltage references are typically based on a bandgap or buried-zener circuit principle.

SUMMARY

Integrated systems that partition circuit components based on environmental sensitivity are disclosed herein. In one example, an integrated circuit package includes a lead frame, a first die, a second, die, an elastomeric material, and a molding compound. The first die is bonded to and electrically connected to the lead frame. The second die is electrically connected to and spaced apart from the first die. The elastomeric material covers the second die. The molding compound encases the first die, the second die, and the elastomeric material. The molding compound includes an inner surface that is spaced apart from the elastomeric material to form a gap between the molding compound and the elastomeric material.

In another example, an integrated circuit package includes a lead frame, a first die, and a second die. The first die is bonded to and electrically connected to the lead frame. The second die is electrically connected to and spaced apart from the first die. A gap between the first die and the second die is filled with a gas.

In a further example, a voltage reference device includes a lead frame, a first die, a second die, and a plurality of bond wires. The first die includes a voltage reference circuit and temperature control circuitry configured to control a temperature of the voltage reference circuit by heating the first die to a predetermined temperature. The second die that is larger than the first die. The second die includes circuitry configured to calibrate the voltage reference circuit. The second die also includes a first side and a second side. The first side is bonded to the lead frame. The second side is opposite the first side, and is adjacent to and spaced apart from the first die. The plurality of bond wires electrically connect the first die to the second die.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The output voltage stability of voltage reference circuits is dependent on a variety of environmental factors including temperature and stress. Stress is introduced by the materials used in the packaging of the semiconductor die and the materials in the semiconductor die itself. Stress originates in the mismatch of material properties, i.e., Thermal Coefficient of Expansion (TCE) between two materials, for example, between silicon and the surrounding packaging, and, on the die, the TCE of base silicon versus oxide, metal layers and passivation used. Embedded stress and mechanical stress coupling in the materials of die construction become observable as: thermal hysteresis during temperature cycling, voltage shift after soldering a voltage reference integrated circuit to a printed circuit board, voltage modulation due to mechanical board flex, and long-term aging due to stress relaxation.

Stress alters electrical performance of the silicon circuit as the "piezo-effect" in ways specific to the circuit components used. The piezo-effect refers to the generation of electricity as a result of mechanical stress applied to a material. The "Piezo-junction" effect refers to a change in the saturation current of the p-n junction of a bipolar transistor resulting from mechanical stress. The Piezo-resistive effect refers to a change in the resistivity of a material due to mechanical stress, and the Piezo-MOS effect refers to mechanical stress induced modification of the drain current though mobility changes of majority carriers in metal oxide semiconductor field effect transistor (MOSFET) devices.

To reduce the introduction of stress in circuit components, some voltage reference circuits use low Young's modulus die attach to attenuate lead-frame to die stress, soft overcoats to buffer mold and filler compound surface stress, packaging that offers high resistance to elastic deformation under load (e.g., ceramics) or open cavity packages to eliminate interactions with the mold compound used in lower cost packages.

Temperature sensitivity is a significant contributor to overall reference accuracy. References with low voltage temperature coefficients (TC), on the order of 2 ppm/C or less, require multiple compensation circuits and testing at several temperatures to apply multiple trims to compensate or "flatten" the temperature response curve. The trims add significant silicon area and test cost to a device. To improve TC by orders of magnitude, some voltage reference circuits regulate the temperature of the silicon by heating the die (ovenizing) to a temperature that is higher than the intended operational range of the device.

Some heated voltage references restrict the level of integration of the heated region in order to maintain a minimal heated surface area and manageable heater power levels. As a result, such implementations are excessively sensitive to thermal Seebeck errors originating between temperature differences and conductor dissimilarities between the heated region and the external circuitry in the surrounding ambient environment. Such implementations require costly external circuitry, that cannot be integrated, that involves discrete trimmed thin film resistor networks and precision amplifiers. In many cases these external circuits require additional ovenization.

Systems of the present disclosure include circuitry that is sensitive to changes in the operational environment. The circuitry of the systems is partitioned in accordance with the environmental sensitivity of the components and/or circuits. Circuitry that is not sensitive to environmental changes (e.g., changes in temperature or mechanical stress) is disposed on a first semiconductor die, and circuitry that is sensitive to environmental changes is disposed on a second semiconductor die. The second semiconductor die may be substantially smaller than the first semiconductor die (e.g., the surface area of the second semiconductor die may 10% or less of the surface area of the first semiconductor die). The first semiconductor die is bonded to the package lead frame, while the second semiconductor die is suspended from the first semiconductor die by bond wires, and disposed in a void of the package or encapsulated in an elastomeric material. Thus, the second semiconductor die is isolated from mechanical stress to which the package is subjected. The second semiconductor die may include temperature control circuitry that maintains the second semiconductor die at a selected temperature. Because the second semiconductor die is small, the power required to maintain the temperature of the second semiconductor die is reduced. Metal conductors within the package (e.g., bond wires, pads and conductors on the first semiconductor die and the second semiconductor die) are coordinated to reduce voltages induced by Seebeck effects.

Various implementations of a voltage reference circuit may be partitioned into a first semiconductor die that includes support circuits that are relatively insensitive to environmental conditions, and a semiconductor circuit die that includes voltage reference circuits that are sensitive to environmental conditions.

Figure 1:
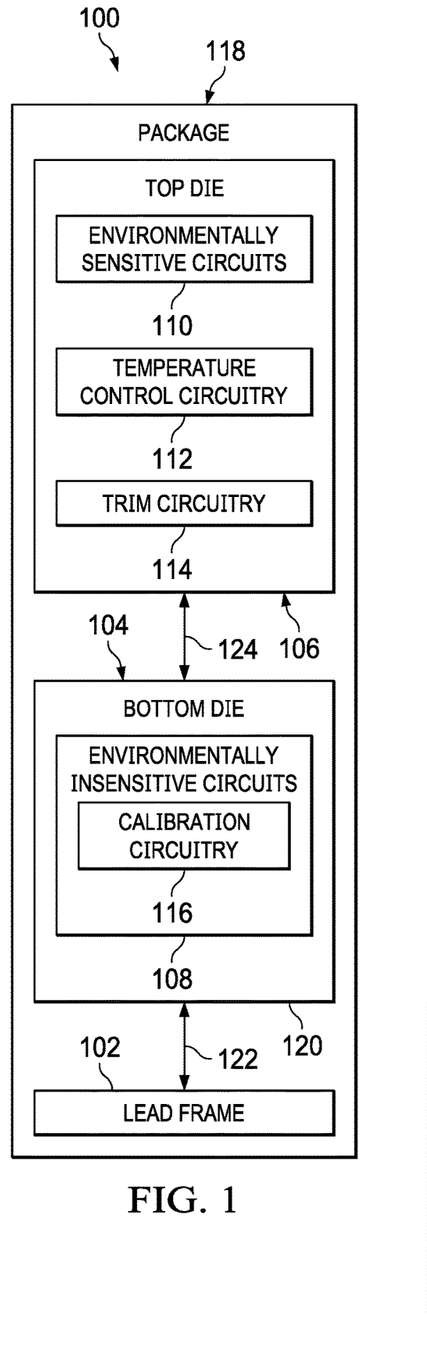
FIG. 1 shows a block diagram for an integrated circuit package with circuitry partitioned based on environmental sensitivity in accordance with various examples.

FIG. 1 shows a block diagram for an integrated circuit package 100 with circuitry partitioned based on environmental sensitivity in accordance with various examples. The integrated circuit package 100 includes a lead frame 102, a die 104, and a die 106. The lead frame 102 is a metallic or laminated structure that includes terminals for conductively connecting the integrated circuit package 100 to circuits external to the integrated circuit package 100. The die 104 is a block of semiconductor material, and is bonded to the lead frame 102 by a conductive adhesive, solder, or other material suitable for attaching a die to a lead frame. More specifically a side 120 of the die 104 is bonded to the lead frame 102. The die 104 is conductively connected to the lead frame 102 by bond wires 122 that extend from terminals of the lead frame 102 to pads of the die 104. The bond wires 122 may be formed of gold, aluminum, copper, palladium coated copper, or other material suitable for conductively connecting the die 104 to the lead frame 102.

The die 106 is block of semiconductor material, and is conductively connected to the die 104 by bond wires 124 that extend from the die 106 to the die 104. The die 106 is not bonded to the lead frame 102 or to die 104, rather, the die 106 is suspended from the die 104 by the bond wires 124 that conductively connect the die 106 to the die 104. The bond wires 124 may be formed of gold, aluminum, copper, palladium coated copper, or other material suitable for conductively connecting the die 106 to the die 104. Spatially, if the lead frame 102 is considered to be disposed below the die 104, then the die 106 is considered to be disposed above the die 104, and separated from the die 104 by a void or an isolation material. The die 106 may be substantially smaller than die 104. For example, the die 106 may be one-tenth or less of the surface area of the die 104.

By physically isolating the die 106 from the lead frame 102 and die 104, the die 106 is isolated from various environmental stresses that affect circuit operation. For example, the die 106 is isolated from mechanical stress to which the lead frame 102 and the die 104 may be subjected. Accordingly, given a system implemented by the integrated circuit package 100, the disposition of the various circuits of the system is determined by the sensitivity of the circuit or component to environmental stress. Environmentally sensitive circuits 110 or components are disposed on the die 106, while environmentally insensitive circuits 108 or components are disposed on the die 104.

The environmentally sensitive circuits 110 or components are those circuits or components that while operating within a specified range of environmental parameters are affected by changes in the operating environment to a degree that detrimentally affects the operation of the integrated circuit package 100. The environmentally insensitive circuits 108 or components are those circuits or components that while operating within the specified range of environmental parameters are not affected by changes in the operating environment to a degree that detrimentally affects the operation of the integrated circuit package 100. For example, digital circuits, while operating within a specified operating parameter range, will generally not be affected by a change in the operating environment to a degree that detrimentally affects the operation of the system containing the digital circuits. Conversely, some analog circuits, even while operating within a specified operating parameter range, may be affected by a change in the operating environment to a degree that detrimentally affects the operation of the system containing the analog circuits.

The die 106 may also include circuits that support the operation of the environmentally sensitive circuits 110. For example, the die 106 may include temperature control circuitry 112 and/or trim circuitry 114. The temperature control circuitry 112 includes circuitry that maintains the die 106, and the environmentally sensitive circuits 110 disposed thereon at a predetermined temperature. Accordingly, the temperature control circuitry 112 may include a heating element, such as a resistive element or a metal oxide semiconductor transistor element, circuits to monitor the temperature of the die 106, and circuits to drive the heating element as needed to maintain the temperature of the die 106 at the predetermined temperature. By maintaining the die 106 at the predetermined temperature, the die 106 is isolated from changes in the ambient temperature external to the integrated circuit package 100. Because the die 106 is small, the power needed to maintain the die 106 at the predetermined temperature is also small. The predetermined temperature may be above a highest normal operating temperature of the integrated circuit package 100.

The trim circuitry 114 may adjust an operating parameter of the environmentally sensitive circuits 110 to optimize operation of the environmentally sensitive circuits 110 over external temperature, residual stress, or other operating conditions. For example, the trim circuitry 114 may adjust an operating current applied in the environmentally sensitive circuits 110 to compensate for changes in the operational performance of the environmentally sensitive circuits 110 over time.

On the die 104, the environmentally insensitive circuits 108 may include calibration circuitry 116 and various other circuits that have been omitted from FIG. 1 in the interest of clarity. For example, the environmentally insensitive circuits 108 may include a pre-regulator, an output driver, trim circuits, a digital interface, and/or communication circuitry, such as a serial communication interface, that allows the integrated circuit package 100 to communicate with systems external to the integrated circuit package 100. The calibration circuitry 116 includes circuity that communicates with the trim circuitry 114 of the die 106. For example, the calibration circuitry 116 may include a calibration controller that communicates adjustment values to the trim circuitry 114, and the trim circuitry 114 may apply the adjustment values to optimize the operation of the environmentally sensitive circuits 110. The calibration circuitry 116 may also include digital storage (e.g., non-volatile memory) that stores adjustment values for provision to the trim circuitry 114 at initialization of the integrated circuit package 100.

The lead frame 102, die 104, die 106, bond wires 122, and bond wires 124 are encased in a package 118. The package 118 may be formed of an epoxy bonding compound, a ceramic material, a plastic material, or any other material suitable for packaging the integrated circuit package 100.

Figure 2:
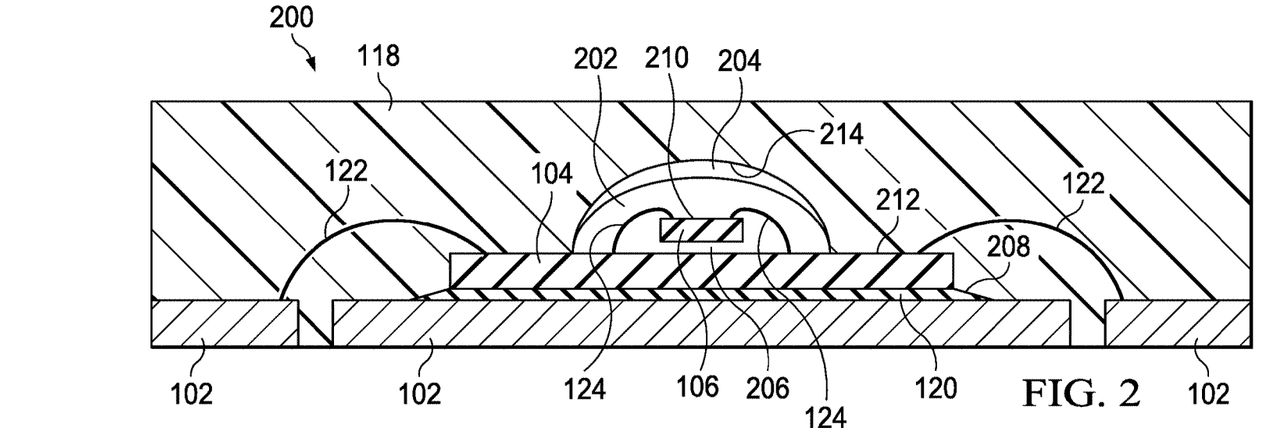
FIG. 2 shows a diagram of an integrated circuit package including a circuit die dedicated to environmentally sensitive circuitry encapsulated in elastomeric material and packaged in a mold compound in accordance with various examples.

FIG. 2 shows a diagram of an integrated circuit package 200. The integrated circuit package 200 is an embodiment of the integrated circuit package 100. The integrated circuit package 200 includes a lead frame 102, a die 104, and a die 106. The die 104 (e.g., the side 120 of the die 104) is bonded to the lead frame 102 by the bonding material 208. The die 104 is conductively connected to the lead frame 102 by the bond wires 122. The die 106 is conductively connected to and suspended from the die 104 by the bond wires 124. That is, one end of a bond wire 124 is conductively connected to a pad on surface 208 of the die 104 and an opposite end of the bond wire 124 is connected to a pad on surface 210 of the die 106. An elastomeric material 202 (such as low modulus silicon compound) surrounds the die 106 and the bond wires 124 filling the space 206 between the die 106 and the die 104. The elastomeric material 202 may be applied after the die 106 is conductively coupled to the die 104 by connecting the bond wires 124 to the die 104 and the die 106. The elastomeric material 202 isolates the die 106 from the environmental stresses (e.g., mechanical stress and/or change in temperature) to which other components (e.g., the lead frame 102, the die 104, etc.) of the integrated circuit package 200 are subjected.

The lead frame 102, the die 104, the die 106, the bond wires 122, the bond wires 124, and the elastomeric material 202 are encapsulated by the package 118. For example, an encapsulation material, such as a mold compound, may be applied using injection molding to form the package 118. After injection of the mold compound that forms the package 118, the package 118 contracts as the mold compound cures to form a gap 204 between the elastomeric material 202 and the inner surface 214 of the mold compound. The gap 204 further isolates the die 106 from the environmental stresses (e.g., mechanical stress and/or change in temperature) to which the package 118 is subjected. The gap 204 is created during cooling of the mold compound. The rate of thermal expansion of the elastomeric material 202 is greater than the rate of thermal expansion of the mold compound. As a result, the elastomeric material 202 shrinks more than the mold compound after completion of the molding process to create the gap 204. A vacuum may be formed in the gap 204, or the gap 204 may be filled with air.

Figure 3:
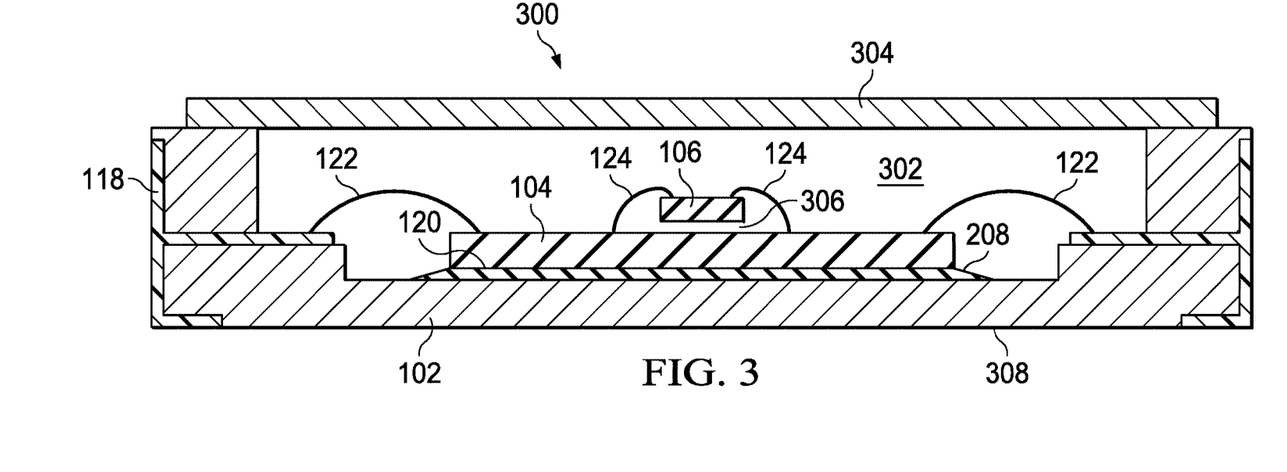
FIG. 3 shows a diagram of an integrated circuit package including a circuit die dedicated to environmentally sensitive circuitry suspended in a void in package in accordance with various examples.

FIG. 3 shows a diagram of an integrated circuit package 300. The integrated circuit package 300 is an embodiment of the integrated circuit package 100. The integrated circuit package 300 includes a lead frame 102, a die 104, and a die 106. In the integrated circuit package 300, the package 118 includes a base 308 and a lid 304. The base 308 may be formed of ceramic, plastic, metal, or other suitable integrated circuit packaging material. The lid 304 may be formed of ceramic, plastic, metal or other material suitable for use as lid of an integrated circuit package. A cavity 302 in the base 308 provides space for housing the die 104 and the die 106. In the cavity 302, the die 104 (e.g., the side 120 of the die 104) is bonded to the lead frame 102 by the bonding material 208. The lead frame 102 is integral with the base 308. The die 104 is conductively connected to the lead frame 102 by the bond wires 122.

The die 106 is conductively connected to and suspended from the die 104 by the bond wires 124. That is, one end of a bond wires 124 is conductively connected to a pad on the surface 208 of the die 104 and an opposite end of the bond wires 124 is connected to a pad on the surface 210 of the die 106. In some implementations, the bond wires 124 are attached when the die 106 is resting on the die 104. In such implementations, at the completion of wire bonding the die 106 is displaced by a mechanical displacement tool creating a void (e.g., a gap filled with air or other gas) 306 between the die 106 and the die 104.

Tension in the bond wires 124 supports and suspends the die 106 relative to the die 104, such that a void 306 is provided between the die 104 and die 106. Due to the rigidity of the bond wires 124 and the small size and mass of the die 106, the die 106 may remain in a fixed position over the die 104 irrespective of external acceleration force. Because the die 106 is isolated from the die 104 by the void 306 and suspended in the cavity 302 by the bond wires 124, the die 106 is isolated from the environmental stresses (e.g., mechanical stress and/or change in temperature) to which other components (e.g., the lead frame 102, the base 308, the die 104, etc.) of the integrated circuit package 300 are subjected.

The lid 304 is bonded to the base 308 after the die 104, the die 106, the bond wires 122, and the bond wires 124 are disposed in the cavity 302. The lid 304 may be bonded to the base 308 by solder, epoxy, melting of the lid material, or other suitable technique for attaching a lid to a base of an integrated circuit package.

Figure 4:
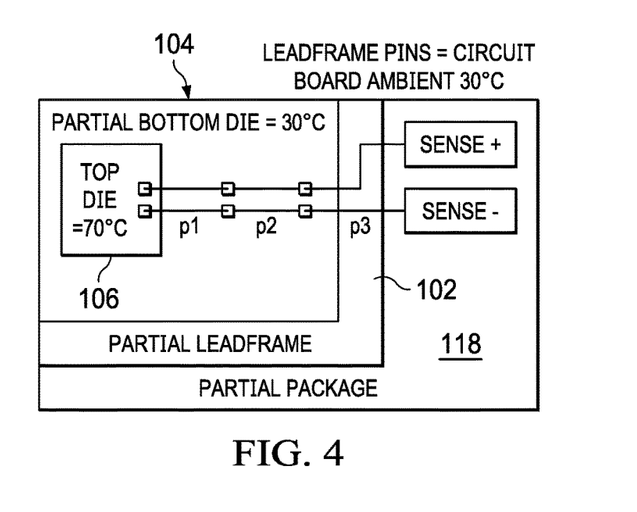
FIG. 4 shows a diagram of interconnecting metal in an integrated circuit package including a circuit die dedicated to environmentally sensitive circuitry in accordance with various examples.

FIG. 4 shows a diagram of interconnecting metal in an integrated circuit package including a semiconductor die dedicated to environmentally sensitive circuitry in accordance with various examples. Seebeck voltages are voltages that are generated when two junctions of dissimilar metals experience a temperature difference. Seebeck voltages can introduce errors in precision circuits that affect circuit accuracy. In implementations of the integrated circuit package 100, Seebeck errors (i.e., errors in a voltage of interest caused by voltages generated by junction of different metals at different temperatures) between the heated die 106, the ambient temperature die 104 and external interconnects are managed in the design of the wire bonding, layout (thermal pairing) and metallization (matched aluminum-aluminum) to eliminate both a major source of voltage error and user design burden. FIG. 4 shows an example of Seebeck error cancellation applied to sense signals in an implementation of the integrated circuit package 100. In the example of FIG. 4, the die 106 is heated to 70° Celsius (C) by the temperature control circuitry 112 while the die 104, the lead frame 102, the package 118, and a circuit board to which the integrated circuit package 100 is attached are at an ambient temperature of 30° C. The interconnect paths P1, P2, and P3 formed by the bond wires 124, metal conductors on the die 104, and the bond wires 122 respectively, cross the temperature zones, but have isothermal connections that result in cancellation of thermo-couple voltages (i.e., Seebeck voltages). Furthermore, the largest temperature difference at P1 (across the bond wires 124) can occur within identical interconnect metallization types. For example, the bond wires 124, the pads of the die 106 and the pads of the die 104 connected to the bond wires 124 may all be formed of a same metal, such as aluminum to avoid Seebeck voltage generation. Thus, implementations of the integrated circuit package 100 avoid or reduce errors caused by Seebeck voltages by ensuring that complementary signals are subject to the same temperature differentials and by providing interconnects that use the same metal.

Figure 5:
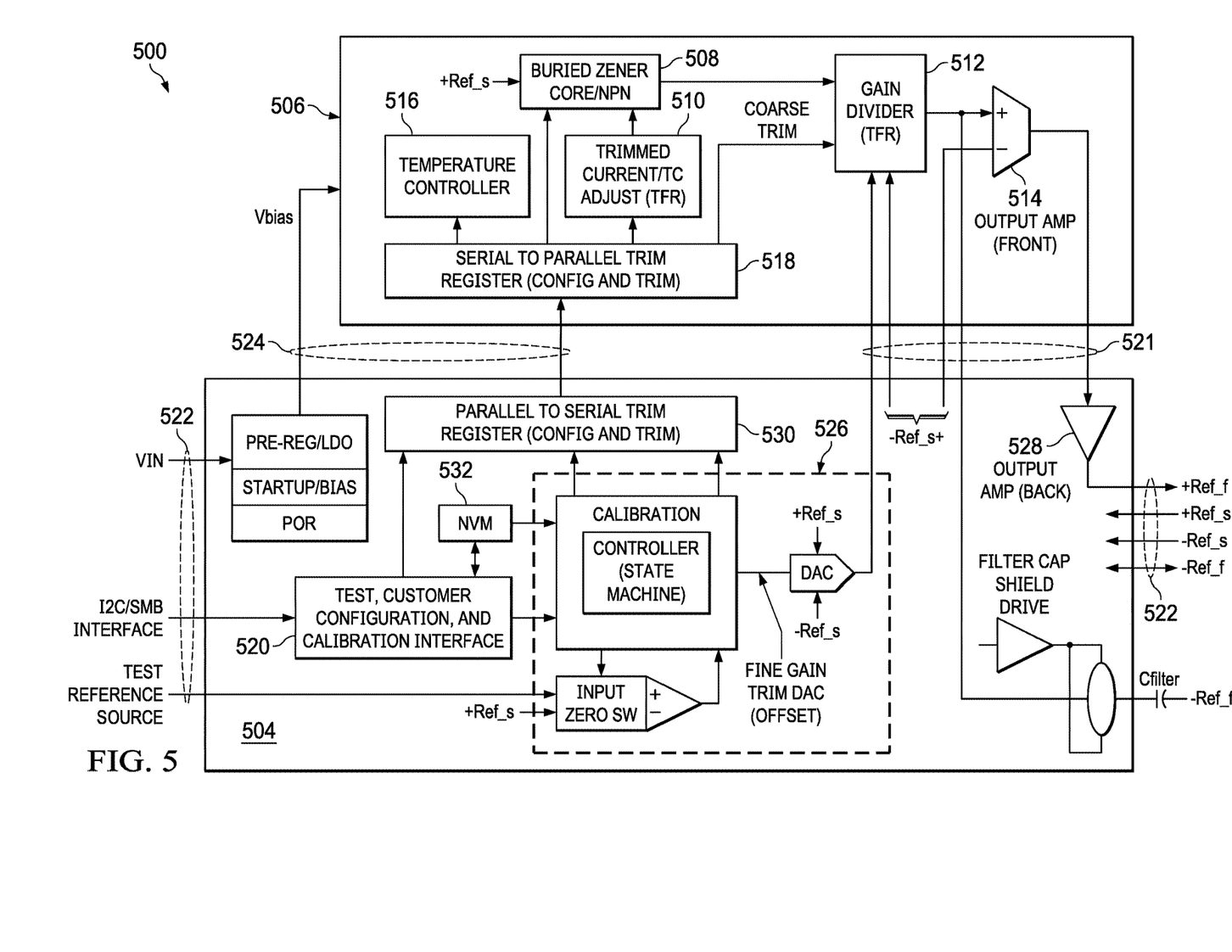
FIG. 5 shows a block diagram for an integrated circuit package including a voltage reference device partitioned based on environmental sensitivity in accordance with various examples.

FIG. 5 shows a block diagram for an integrated voltage reference device 500 partitioned based on environmental sensitivity in accordance with various examples. The integrated voltage reference device 500 is an example of the integrated circuit package 100. The integrated voltage reference device 500 includes a die 504 and a die 506. The die 504 is an implementation of the die 104, and the die 506 is an implementation of the die 106. The die 504 is bonded to a lead frame and conductively coupled to the lead frame by bond wires 522. The die 506 is suspended from the die 504 and conductively coupled to the die 504 by the bond wires 524. The circuits of the integrated voltage reference device 500 have been partitioned between the die 504 and the die 506 based on environmental sensitivity.

Environmentally sensitive components provided on the die 506 includes a voltage reference circuit 508, such as a buried Zener core or a bandgap core device (e.g., an NPN transistor), thin film resistors 510, 512, and an amplifier front end 514. The die 506 also includes temperature control circuitry 516 and trim circuitry 518. The temperature control circuitry 516 is an implementation of the temperature control circuitry 112, and maintains the temperature of the die 506 at a predetermined temperature value. The trim circuitry 518 is an implementation of the trim circuitry 114, and receives adjustment values from the die 104 and applies the adjustment values to optimize the operation of integrated voltage reference device 500.

The die 504 includes support circuitry that are insensitive to the environment within the specified operating range of the integrated voltage reference device 500. More specifically, the die 504 includes external communication interface circuitry 520, calibration circuitry 526, non-volatile memory 528, serialization circuitry 530 for communicating with the die 506, and amplifier back end circuitry 528. The calibration circuitry 526 provides adjustment values to the die 506. The non-volatile memory 528 stores adjustment values for provision to the die 506 at initialization. The external communication interface circuitry 520 provides an interface that allows the integrated voltage reference device 500 to communicate with circuits and systems external to the integrated voltage reference device 500. The serialization circuitry 530 provides serial communication between the die 504 and the die 506. The amplifier back end circuitry 528 buffers the reference voltage output of the integrated voltage reference device 500.

Various implementations of the integrated voltage reference device 500 may be arranged as shown in FIG. 2 or FIG. 3. By partitioning the circuits of the integrated voltage reference device 500 across the die 504 and the die 506, the integrated voltage reference device 500 can provide a stable reference voltage output with lower operational power and in less space than conventional circuits that provide similar stability. Environmentally sensitive components disposed on the die 506 are isolated from mechanical stress and temperature changes in the environment outside the integrated voltage reference device 500.

Figure 6:
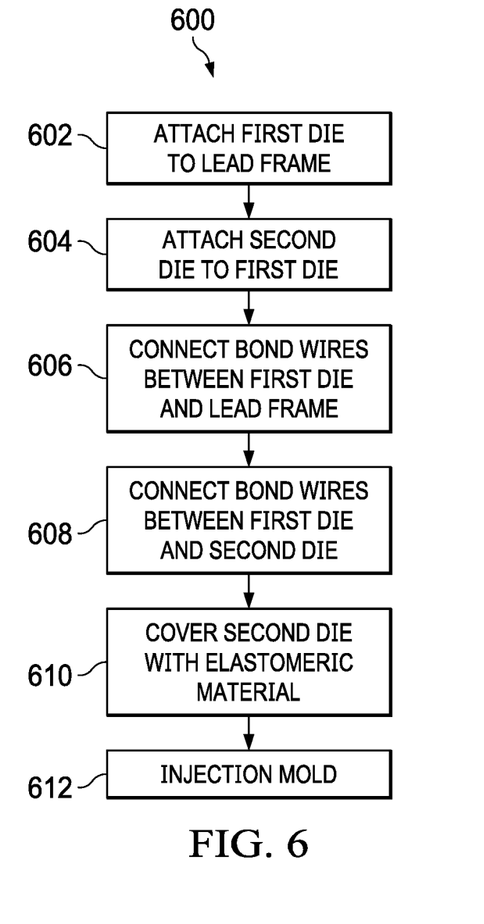
FIG. 6 shows a flow diagram for a method for manufacturing an integrated circuit package in accordance with the present disclosure.

FIG. 6 shows a flow diagram for a method 600 for manufacturing the integrated circuit package 200. Though depicted sequentially as a matter of convenience, at least some of the actions shown can be performed in a different order and/or performed in parallel. Additionally, some implementations of the method 600 may perform only some of the actions shown.

In block 602, the die 104 is attached to the lead frame 102. For example, the die 104 may be attached to the lead frame 102 using an epoxy-based adhesive.

In block 604, the die 106 is attached to the die 104. For example, a layer of low modulus elastomeric material 202 may be disposed between a surface of the die 104 opposite the surface of the die 104 attached to the lead frame 102 and a first surface of the die 106. The elastomeric material 202 may be polymerized in a curing process.

In block 606, the die 104 is electrically connected to the lead fame 102 by attaching the bond wires 122 to terminals of the die 104 and terminals of the lead frame 102.

In block 606, the die 106 is electrically connected to the die 104 by attaching the bond wires 124 to terminals of the die 106 and terminals of the die 104.

In block 608, a quantity of the elastomeric material 202 is dispensed over the die 106 and the bond wires 124. The elastomeric material 202 forms a dome that covers the die 106 and the bond wires 124. The elastomeric material 202 may be polymerized in a curing process.

In block 610, the die 104, the die 106, the bond wires 122, the bond wires 124, the elastomeric material 202 and at least a portion of the lead frame 102 are encapsulated in a molding compound. The molding compound is liquefied by heat and forced into a mold cavity containing the die 104, the die 106, the bond wires 122, the bond wires 124, the elastomeric material 202 and at least a portion of the lead frame 102. The elastomeric material 202 has a higher rate of thermal expansion than the molding compound. As the integrated circuit package 200 cools, the elastomeric material 202 shrinks more than the surrounding molding compound and the gap 204 forms between the elastomeric material 202 and the molding compound.

Figure 7:
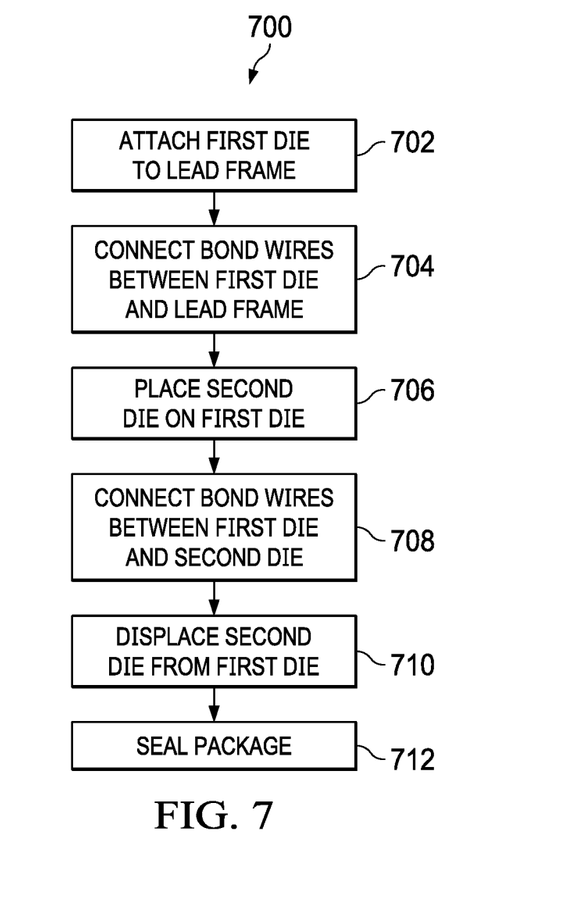
FIG. 7 shows a flow diagram for a method for manufacturing an integrated circuit package in accordance with the present disclosure.

FIG. 7 shows a flow diagram for a method 700 for manufacturing the integrated circuit package 300. Though depicted sequentially as a matter of convenience, at least some of the actions shown can be performed in a different order and/or performed in parallel. Additionally, some implementations of the method 700 may perform only some of the actions shown.

In block 702, the die 104 is attached to the lead frame 102. The lead frame 102 is integral with the base 308 of the package 118. For example, the die 104 may be attached to the lead frame 102 and/or the base 308 using an epoxy-based adhesive.

In block 704, the die 104 is electrically connected to the lead fame 102 by attaching the bond wires 122 to terminals of the die 104 and terminals of the lead frame 102.

In block 706, the die 106 is positioned with respect to the die 104. In some implementations, a placement tool may position and deposit the die 106 directly atop the die 104 such that a side of the die 106 is in contact with the die 104.

In block 708, the placement tool holds the die 106 in place, and the die 106 is electrically connected to the die 104 by attaching the bond wires 124 to terminals of the die 106 and terminals of the die 104.

In block 710, the placement tool displaces the die 106 from the die 104 to create the gap 306 between the die 104 and the die 106. Tension of the bond wires 124 maintain the position of the die 106 as spaced apart from the die 104. In some embodiments, a spacer may be disposed between the die 104 and the die 106 in block 706, and the spacer removed in block 710 to create the gap 306.

In block 712, the package 118 is sealed by bonding the lid 304 to the base 308.

The above discussion is meant to be illustrative of the principles and various examples of the present invention. Numerous variations and modifications will become apparent to those skilled in the art once the above disclosure is fully appreciated. It is intended that the following claims be interpreted to embrace all such variations and modifications.

What is claimed is:

1. An integrated circuit package, comprising:
a lead frame;
a first die bonded to and electrically connected to the lead frame;
a second die electrically connected to and spaced apart from the first die;
a silicon compound including a modulus covering the second die and in between a bottom surface of the second die and a top surface of the first die; and
a molding compound covering the first die, the second die, and the silicon compound; the molding compound comprising an inner surface that is spaced apart from the silicon compound to form a gap between the molding compound and the silicon compound, wherein the first die includes calibration circuitry configured to provide adjustment values to the second die; and
wherein the second die comprises trim circuitry configured to apply the adjustment values to the electronic circuit of the second die.

2. The integrated circuit package of claim 1, wherein the silicon compound is disposed between the first die and the second die.

3. The integrated circuit package of claim 1, wherein an electronic circuit constructed on the second die is more sensitive to a change in environmental conditions than is an electronic circuit constructed on the first die.

4. The integrated circuit package of claim 1, wherein the first die is larger than the second die.

5. The integrated circuit package of claim 1, wherein the second die comprises temperature control circuitry configured to control a temperature of the second die by heating the second die to a predetermined temperature; and wherein a temperature of the first die is variant with ambient temperature.

6. The integrated circuit package of claim 1, wherein:
the bond wires that electrically connect the second die to the first die are formed of a same material; and
pads on the first die and the second die to which the bond wires are connected are formed of the same material.

7. The integrated circuit package of claim 1, wherein the first die comprises support circuitry for the second die, the support circuitry comprising one or more of a pre-regulator, an output driver, a trim circuit, a calibration controller, or a digital interface.

8. A voltage reference device, comprising:
a lead frame;
a first die comprising:
a voltage reference circuit; and
temperature control circuitry configured to control a temperature of the voltage reference circuit by heating the first die to a predetermined temperature;
a second die that is larger than the first die, the second die comprising:
circuitry configured to calibrate the voltage reference circuit;
a first side that is bonded to the lead frame; and
a second side that is opposite the first side, and is adjacent to and spaced apart from the first die; and
a plurality of bond wires that electrically connect the first die to the second die.

9. The voltage reference device of claim 8, further comprising:
a silicon compound that covers the first die and separates the first die from the second die; and
encapsulation material covering the second die and the silicon compound;
a gap disposed between the encapsulation material and the silicon compound.

10. The integrated voltage reference device of claim 8, wherein the bond wires that electrically connect the second die to the first die space the second die from the first die to a create a gap filled with gas between the first die and the second die.

11. The voltage reference device of claim 8, wherein:
the bond wires that electrically connect the first die to the second die are formed of
a same material; and
pads on the second die and pads on the first die to which the bond wires are connected are formed of the same material.

* * * * *